United States Patent [19]
Ishibashi et al.

[11] Patent Number: 5,546,418
[45] Date of Patent: Aug. 13, 1996

[54] SEMICONDUCTOR LASER HAVING A FLAT GROOVE FOR SELECTED CRYSTAL PLANES

[75] Inventors: Akihiko Ishibashi, Sakai; Isao Kidoguchi, Mino; Kiyoshi Ohnaka, Moriguchi; Masaya Mannou, Hiragata, all of Japan

[73] Assignee: Matsushita Electric Industrial Co., Ltd., Osaka, Japan

[21] Appl. No.: 280,936

[22] Filed: Jul. 27, 1994

[30] Foreign Application Priority Data

Jul. 28, 1993 [JP] Japan ................................ 5-186023
Aug. 23, 1993 [JP] Japan ................................ 5-207689

[51] Int. Cl.⁶ ............................................... H01S 3/19
[52] U.S. Cl. ............................................ 372/48; 372/46
[58] Field of Search ........................... 372/48, 47, 43, 372/46

[56] References Cited

U.S. PATENT DOCUMENTS

| | | |
|---|---|---|
| 4,099,999 | 7/1978 | Burnham et al. . |
| 4,321,556 | 3/1982 | Sakuma . |
| 4,326,176 | 4/1982 | Aiki et al. . |
| 4,545,057 | 10/1985 | Hayakawa et al. . |
| 5,010,556 | 4/1991 | Imanaka et al. ........................... 372/48 |
| 5,065,200 | 11/1991 | Bhat et al. ................................ 372/47 |
| 5,115,443 | 5/1992 | Miyazawa ................................ 372/46 |
| 5,138,625 | 8/1992 | Paoli et al. ............................... 372/48 |
| 5,153,890 | 10/1992 | Bona et al. ............................... 372/48 |
| 5,173,913 | 12/1992 | Kaneno .................................... 372/48 |
| 5,373,521 | 12/1994 | Takahashi ................................ 372/46 |
| 5,376,583 | 12/1994 | Northrup et al. . |
| 5,403,774 | 4/1995 | Shieh et al. . |

OTHER PUBLICATIONS

K. Itaya et al., "New Window–Structure InGaAlP Visible Light Laser Diodes by Self–Selective Zn Diffusion–Induced Disordering", *IEEE Journal of Quantum Electronics*, vol. 27, No. 6, pp. 1496–1500 (Jun. 1991).

Primary Examiner—Rodney B. Bovernick
Assistant Examiner—Yisun Song
Attorney, Agent, or Firm—Ratner & Prestia

[57] ABSTRACT

A semiconductor laser of the invention includes a (100) GaAs substrate having at least one stripe groove formed on an upper face thereof, and a semiconductor multilayer structure formed on the substrate. The stripe groove extends along a <1-10> direction. The semiconductor multilayer structure includes an $Al_xGa_{1-x}As$ layer ($0 \leq x \leq 1$) including a portion having a surface of an (a11) crystal plane (a>1), the portion being positioned on the stripe groove, a pair of AlGaInP cladding layers provided on the $Al_xGa_{1-x}As$ layer ($0 \leq x \leq 1$), and an active layer sandwiched between the pair of AlGaInP cladding layers.

6 Claims, 10 Drawing Sheets

SEMICONDUCTOR LASER HAVING A FLAT GROOVE FOR SELECTED CRYSTAL PLANES

BACKGROUND OF THE INVENTION

1. Field of the Invention

The present invention relates to a semiconductor laser and a method for fabricating the semiconductor laser. More particularly, the present invention relates to a semiconductor laser capable of emitting visible light which is suitable for recording and reproducing information or for other operations for an optical recording medium, and a method for fabricating the semiconductor laser.

2. Description of the Related Art

An AlGaInP-type red-light semiconductor laser which oscillates in the 670 nanometers (nm) waveband was commercially available in 1988. The AlGaInP-type red-light semiconductor laser has hitherto been considered as an important component as a light source for an information processing apparatus such as a laser printer or an optical disk, and has been intensively studied and developed. The target of development was initially a semiconductor laser having an oscillating wavelength of the 670–680 nm range. In order to meet recent requirements such as the improvement in the visibility of a bar-code reader and the higher density of optical disk, the employed range of the oscillating wavelength is changed to be the 630 nm range which is the same level as that of the He-Ne gas laser. In future, as the storage capacity of an optical disk is increased, it will be required to realize a semiconductor laser which emits laser light from the blue and green region to the ultraviolet region which has shorter wavelengths than that of the red light. In addition, since it is possible to control the p-type conductivity of II-VI group semiconductors, the study of a II-VI group visible-light semiconductor laser rapidly progresses.

In order to shorten the oscillating wavelength, it is necessary to increase the bandgap of an active layer. However, the increase of the bandgap of the active layer results in an increase of overflow currents of electrons from the active layer to a p-type cladding layer. The overflow currents of electrons cause the temperature characteristic of a semiconductor laser to deteriorate. The deterioration of the temperature characteristic is a significant factor which limits the reduction of oscillating wavelength. In order to avoid the overflow of electrons, the composition ratio of Al in the cladding layer is increased so as to increase the bandgap between the active layer and the p-type cladding layer, or the carrier concentration of the p-type cladding layer is increased. However, in metal organic vapor phase epitaxy (MOVPE), there exists a problem in that it is difficult to dope an AlGaInP layer containing Al at a higher composition ratio with p-type impurities at a high concentration. The p-type concentration of the AlGaInP layer containing Al at a higher composition ratio is about $7 \times 10^{17}$ cm$^{-3}$ at the best.

Recently, as effective means for shortening the wavelength, the use of a (100) GaAs substrate which is slanted in a <110> direction is being intensively studied. When such a slanted substrate is used, it is possible to increase the p-type impurity concentration of the AlGaInP layer. In addition, a phenomenon, which is inherent to the AlGaInP type material, in that a natural superlattice that is inevitably formed can be suppressed. The formation of the natural superlattice may result in a reduction of the bandgap, so that the use of the slanted substrate suppresses the reduction of the bandgap.

SUMMARY OF THE INVENTION

The semiconductor laser of this invention includes a (100) GaAs substrate having at least one stripe groove formed on an upper face thereof; and a semiconductor multilayer structure formed on the substrate, wherein the stripe groove extends along a <1–10> direction, and the semiconductor multilayer structure includes: an Al$_x$Ga$_{1-x}$As layer ($0 \leq x \leq 1$) including a portion having a surface of an (a11) crystal plane (a>1), the portion being positioned on the stripe groove; a pair of AlGaInP cladding layers provided on the Al$_x$Ga$_{1-x}$As layer ($0 \leq x \leq 1$); and an active layer sandwiched between the pair of AlGaInP cladding layers.

According to another aspect of the invention, a method for fabricating a semiconductor laser includes the steps of: forming at least one stripe groove on an upper face of a (100) GaAs substrate; and forming a semiconductor multilayer structure on the substrate, wherein the step of forming the stripe groove includes a step of etching a region of the substrate extending along a <1–10> direction, and the step of forming the semiconductor multilayer structure includes the steps of: performing vapor phase epitaxy at temperatures in the range of 400° C. to 700° C., so as to deposit on the substrate, an Al$_x$Ga$_{1-x}$As layer ($0 \leq x \leq 1$) including a portion having a surface of an (a11) crystal plane (a>1), the portion being positioned on the stripe groove; and growing a first AlGaInP cladding layer of a first conductivity type, an active layer, and a second AlGaInP cladding layer of a second conductivity type at temperatures of 600° C. or more.

According to another aspect of the invention, a semiconductor laser includes: a (100) GaAs substrate having at least one stripe groove formed on an upper face thereof; and a semiconductor multilayer structure formed on the substrate, wherein the stripe groove extends along a <1–10> direction, and the semiconductor multilayer structure includes: an Al$_x$Ga$_{1-x}$As layer ($0 \leq x \leq 1$) including a portion having a surface of an (a11) crystal plane (a>1), the portion being positioned on the stripe groove; an AlGaInP layer provided on the Al$_x$Ga$_{1-x}$As layer ($0 \leq x \leq 1$); a pair of cladding layers of II-VI group semiconductors, provided on the AlGaInP layer; and an active layer sandwiched between the pair of cladding layers.

According to still another aspect of the invention, a method for fabricating a semiconductor laser includes the steps of: forming at least one stripe groove on an upper face of a (100) GaAs substrate; and forming a semiconductor multilayer structure on the substrate, wherein the step of forming the stripe groove includes a step of etching a region of the substrate extending along a <1–10> direction, and the step of forming the semiconductor multilayer structure includes the steps of: performing vapor phase epitaxy at temperatures in the range of 400° C. to 700° C., so as to deposit, on the substrate, an Al$_x$Ga$_{1-x}$As layer ($0 \leq x \leq 1$) including a portion having a surface of an (a11) crystal plane (a>1), the portion being positioned on the stripe groove; growing an AlGaInP layer on the Al$_x$Ga$_{1-x}$As layer ($0 \leq x \leq 1$) at temperatures of 600° C. or more; and successively depositing a first cladding layer, an active layer, and a second cladding layer, the first and second cladding layers being formed of II-VI group semiconductors.

According to still another aspect of the invention, a method for fabricating a semiconductor laser includes the steps of: forming a semiconductor multilayer structure on a semiconductor substrate, the semiconductor multilayer structure including a semiconductor layer doped with impurities and an active layer with a natural superlattice; forming a mask layer against hydrogen atoms on a predetermined region of an upper face of the semiconductor multilayer structure; and annealing the semiconductor multilayer structure in a gas containing hydrogen atoms, and selectively diffusing the impurities from the impurity doped semiconductor layer to the predetermined region, whereby a bandgap of the predetermined region of the active layer is made larger than that of a region other than the predetermined region of the active layer.

Thus, the invention described herein makes possible the advantages of (1) providing an AlGaInP type semiconductor laser in which the carrier density of the p-type AlGaInP cladding layer is increased without using a slanted substrate and one which can realize a stable fundamental traverse mode, and a fabrication method capable of precisely controlling the characteristics of the semiconductor laser, (2) providing a II–VI group semiconductor layer in which a potential barrier is reduced and which can realize a stable traverse mode, and a fabrication method capable of precisely controlling the characteristics of the semiconductor laser, and (3) providing a method for fabricating a semiconductor laser with high reliability and capable of high output operation.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
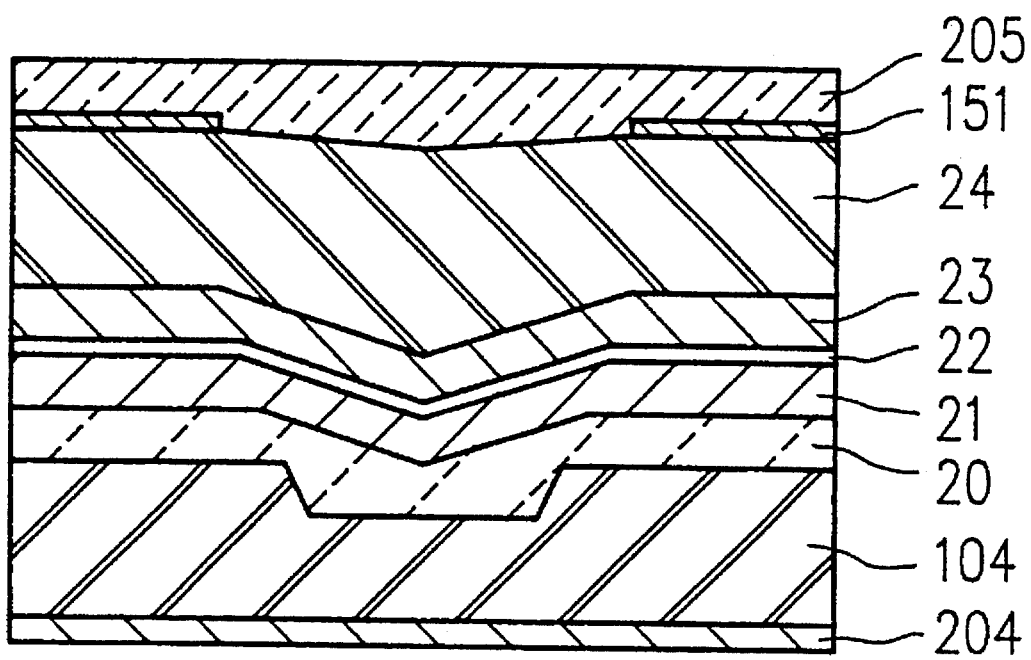
FIG. 1 is a cross-sectional view showing the structure of a semiconductor laser in a first example according to the invention.

First referring to FIG. 1, a semiconductor laser in a first example according to the invention will be described. As shown in FIG. 1, the semiconductor laser in this example includes a p-GaAs substrate 104 having a stripe groove formed in the upper face thereof, and a semiconductor multilayer structure formed on the substrate. The p-GaAs substrate 104 is a GaAs substrate having an upper face of a (100) crystal plane (hereinafter, referred to as "a (100) GaAs substrate"). The stripe groove extends along a <1–10> direction.

The semiconductor multilayer structure includes a p-GaAs layer 20 having a portion which has a surface of an (a11) crystal plane (a>1) and is positioned above the stripe groove, a p-AlGaInP cladding layer 21, a multi quantum-well (MQW) active layer 22, an n-AlGaInP cladding layer 23, and an n-GaAs contact layer 24, in this order. Alternatively, instead of the p-GaAs layer 20, another semiconductor layer which is expressed as an $Al_xGa_{1-x}As$ layer ($0 \leq x \leq 1$) may be used.

On the n-GaAs contact layer 24, an $SiO_2$ film 151 (an insulating film) having a stripe opening is provided. An n-side electrode 205 is deposited on the $SiO_2$ film 151 so as to be in contact with a part of the n-GaAs contact layer 24 through the opening. A p-side electrode 204 is deposited on a bottom face of the p-GaAs substrate 104.

In the p-GaAs layer 20 formed on the stripe groove, the surface of the portion positioned above the stripe groove includes two slopes, so that the cross section of the surface is V-shaped. In this example, the slope is a (311) crystal plane. On the portion having the V-shaped surface of the p-GaAs layer 20, the cross section of a double-heterostructure including the p-AlGaInP cladding layer 21, the MQW active layer 22, and the n-AlGaInP cladding layer 23 is also V-shaped. This is because these semiconductor layers are grown so as to maintain the V-shape of the underlying layers. In each of the semiconductor layers, a portion positioned above the stripe groove of the substrate 104 is sometimes referred to as "a V-shaped portion". However, the semiconductor laser which is formed as an upper layer than the p-GaAs layer 20 is not necessarily grown so as to maintain the V-shape. Alternatively, the portion positioned above the stripe groove may include a flat portion.

A current flowing between the p-side electrode 204 and the n-side electrode 205 is confined by the $SiO_2$ film 151. As a result, the current vertically flows through the V-shaped portions of the respective semiconductor layers. According to the structure of this example, laser light which stably oscillates in a single fundamental lateral mode can be obtained from the V-shaped portion of the active layer 22.

Next, a method for fabricating the semiconductor laser shown in FIG. 1 will be described with reference to FIGS. 2A to 2C.

Figure 2A:
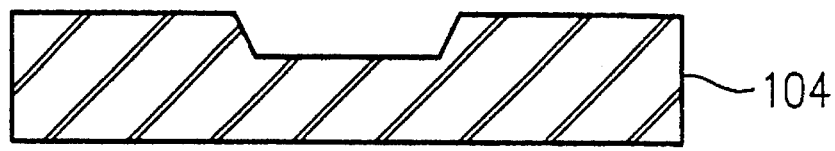
FIGS. 2A to 2C are cross-sectional views illustrating steps of a method for fabricating the semiconductor laser in the first example according to the invention.

First, as shown in FIG. 2A, a stripe groove is formed in an upper face of a p-GaAs substrate 104. The groove is formed in the following manner. After a photoresist having a stripe opening is formed on the upper face of the p-GaAs substrate 104, the exposed region of the p-GaAs substrate 104 is etched so as to reach an appropriate depth using the photoresist as an etching mask. For the etching, a sulfuric-acid type etchant can be used. The etching mask is not limited to the photoresist. The etching mask is only required to be formed of a material of which the etching rate is sufficiently lower than the etching rate of GaAs. The patterning of the etching mask is implemented so that the stripe opening extends along the <1–10> direction.

Figure 2B:
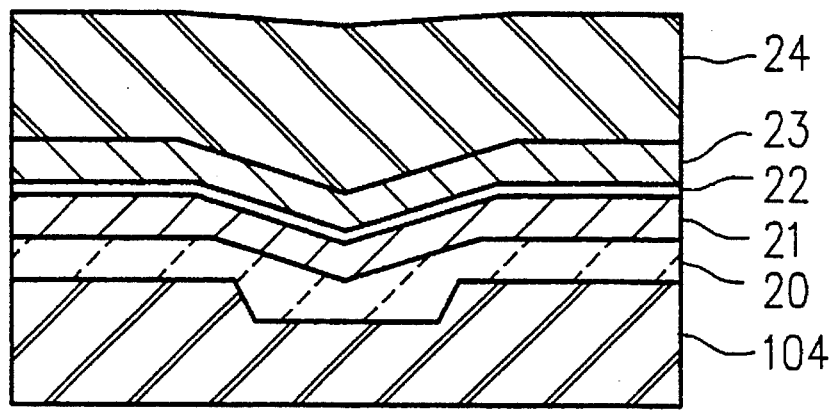

Next, using MOVPE, a p-GaAs layer 20, a p-AlGaInP cladding layer 21, an MQW active layer 22, an n-AlGaInP cladding layer 23, and an n-GaAs contact layer 24 are successively epitaxially grown on the stripe groove as shown in FIG. 2B. The growth process is described in detail below.

The substrate shown in FIG. 2A is degreased and cleaned. Then, immediately after a native oxide layer formed on the surface of the substrate is removed by HCl, the substrate is loaded in an MOVPE growth furnace. Using trimethyl gallium (TMGa) and arsine ($ASH_3$), the p-GaAs layer 20 is formed under the conditions of the V/III ratio of 50 and the growth temperature of 600° C. As the p-type dopant, dimethyl zinc (DMZn) is used. Thereafter, the growth temperature is raised to 750° C., and trimethyl gallium (TMGa), trimethyl aluminum (TMAl), trimethyl indium (TMIn), and phosphine ($PH_3$) are used, so that the p-AlGaInP cladding layer 21, the MQW active layer 22, the n-AlGaInP cladding layer 23, and the n-GaAs contact layer 24 are successively grown. As the p-type dopant, dimethyl zinc (DMZn) is used, and as the n-type dopant, monosilane ($SiH_4$) is used. When the MOVPE growth is performed under the above-mentioned conditions, a (311) crystal plane appears at the surface of the portion of the p-GaAs layer 20 above the stripe groove, so as to obtain a V-shaped surface of the (311) face. In the double-heterostructure thereon, crystal having good crystallinity is grown while substantially maintaining the surface structure of the p-GaAs layer 20.

Figure 2C:
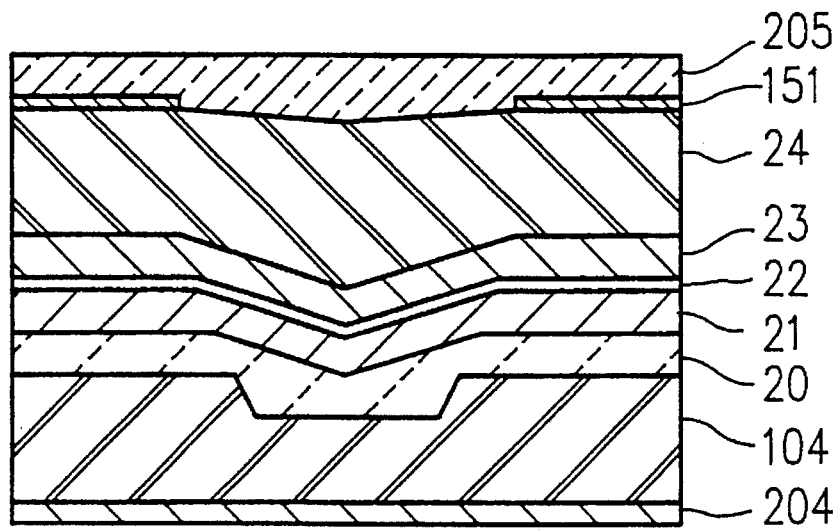

Next, an $SiO_2$ film (an insulating film) 151 for confining a current and electrodes 204 and 205 are formed by known methods, so as to obtain a semiconductor laser shown in FIG. 2C.

If an AlGaInP layer is epitaxially grown on a ridge stripe having a side face of a (111) crystal plane by the conventional method, the AlGaInP layer formed on the side face includes many defects, and the surface thereof is rough. However, according to a study by the inventors of this invention, it is confirmed that an (a11) GaAs face (a>1) can appear under the limited condition of 400° C.<Tg<700° C., where Tg is the growth temperature, an AlGaInP layer can be grown on the (a11) face so as to have a good mirror surface under the limited condition of Tg>600° C., and a carrier density of the p-AlGaInP layer can be increased as compared with that of a (100) face.

The luminous energy by PL (photoluminescence) of the AlGaInP layer formed on the (a11) face is higher than in the case where the layer is formed on the (100) flat face by 40 meV, and the carrier density is twice as high as that on the flat face. These show that this example can attain the same effects as those in the case where a slanted substrate is used.

In addition, the carrier density in the V-shaped portion is higher than that of the flat portion around the V-shaped portion, so that the current can efficiently be concentrated in the V-shaped portion. As a result, the threshold value can be lowered.

According to the semiconductor laser of this example, the laser light is confined in the V-shaped portion, and the stable fundamental lateral mode oscillation can be attained. The oscillating wavelength is 630 nm, and the threshold current is as low as 25 mA. The highest oscillation temperature is 100° C. which is extremely high in this wavelength range. Such a high temperature can be obtained as the result of sufficiently increasing the carrier density of the p-type cladding layer. The current is continuously passed under the conditions of 50° C. and 10 mW. Moreover, even after 1000 hours, no deterioration can be observed. This means that the crystal of good crystallinity is formed. For comparison, in a device having the same device structure formed on a flat portion, the threshold current was 80 mA, and the highest oscillation temperature was 45° C.

EXAMPLE 2

Figure 3:
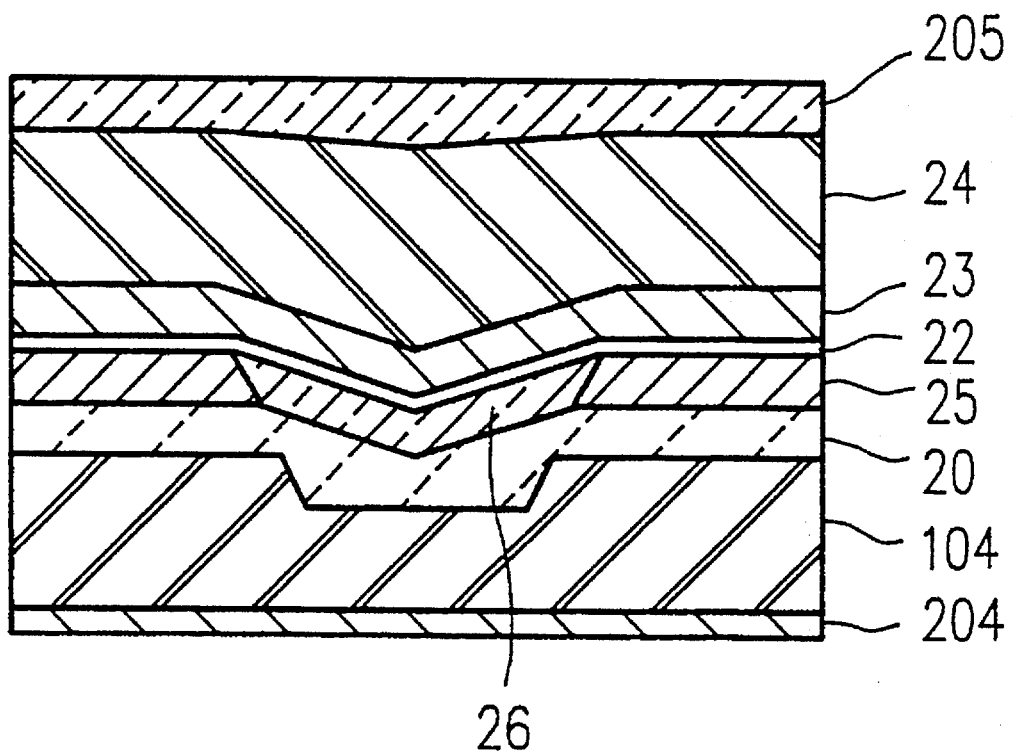
FIG. 3 is a cross-sectional view showing the structure of a semiconductor laser in a second example according to the invention.

Referring to FIG. 3, a semiconductor laser in a second example according to the invention will be described. In FIG. 3, like components are indicated by like reference numerals used in Example 1 shown in FIG. 1.

As shown in FIG. 3, the semiconductor laser in this example includes a p-GaAs substrate 104 having a stripe groove formed in the upper face thereof, and a semiconductor multilayer structure formed on the substrate. The p-GaAs substrate 104 is a (100) GaAs substrate. The stripe groove extends along a <1–10> direction.

The semiconductor multilayer structure includes a p-GaAs layer 20 having a portion which has a surface of an (a11) crystal plane (a>1) and is positioned above the stripe groove, an AlGaInP current-confining cladding layer 25, a multi quantum-well (MQW) active layer 22, an n-AlGaInP cladding layer 23, and an n-GaAs contact layer 24, in this order. Alternatively, instead of the p-GaAs layer 20, another semiconductor layer which is expressed as $Al_xGa_{1-x}As$ layer ($0 \leq x \leq 1$) may be used.

On the n-GaAs contact layer 24, an n-side electrode 205 is deposited. A p-side electrode 204 is deposited on a bottom face of the p-GaAs substrate 104.

Next, a method for fabricating the semiconductor laser shown in FIG. 3 will be described.

First, a stripe groove is formed in an upper face of a p-GaAs substrate 104. The groove is formed in the following manner. After a photoresist having a stripe opening is formed on the upper face of the p-GaAs substrate 104, the exposed region of the p-GaAs substrate 104 is etched so as to reach an appropriate depth using the photoresist as an etching mask. For the etching, a sulfuric-acid type etchant can be used. The etching mask is not limited to the photoresist. The etching mask is only required to be formed of a material of which the etching rate is sufficiently lower than the etching rate of GaAs. The patterning of the etching mask is implemented so that the stripe opening extends along the <1–10> direction.

Next, using MOVPE, a p-GaAs layer 20, an AlGaInP current-confining cladding layer 25, an MQW active layer 22, an n-AlGaInP cladding layer 23, and an n-GaAs contact layer 24 are successively epitaxially grown on the stripe groove. The growth process is described in detail below.

The substrate on which the stripe groove is formed is degreased and cleaned. Then, immediately after an oxide layer formed on the surface of the substrate is removed by HCl, the substrate is located in an MOVPE growth furnace. Using trimethyl gallium (TMGa) and arsine (ASH₃), the p-GaAs layer 20 is formed under the conditions of the V/III ratio of 50 and the growth temperature of 600° C. As the p-type dopant, dimethyl zinc (DMZn) is used. Thereafter, the growth temperature is raised to 750° C., and trimethyl gallium (TMGa), trimethyl aluminum (TMAl), trimethyl indium (TMIn), and phosphine (PH₃) are used, so that the AlGaInP current-confining cladding layer 25, the MQW active layer 22, the n-AlGaInP cladding layer 23, and the n-GaAs contact layer 24 are successively grown. As the p-type dopant, dimethyl zinc (DMZn) is used, and as the n-type dopant, monosilane (SiH₄) is used. It is noted that when the AlGaInP current-confining cladding layer 25 is to be formed, doping of DMZn and doping of SiH₄ are simultaneously performed. Finally, electrodes 204 and 205 are formed, so as to obtain a semiconductor laser shown in FIG. 3.

When the MOVPE growth is performed under the above-mentioned conditions, a (311) crystal plane appears at the surface of the portion of the p-GaAs layer 20 above the stripe groove, so as to obtain a V-shaped surface of the (311) face. In the double-heterostructure thereon, crystal having good crystallinity is grown while substantially maintaining the surface structure of the p-GaAs layer 20.

According to the study by the inventors of this invention, the difference between Example 2 and Example 1 is in that the AlGaInP current-confining cladding layer 25 in Example 2 has a current-confining structure. According to the study by the inventors of this invention, the AlGaInP layer grown on the (a11) has a relatively higher p-type carrier density or a relatively lower n-type carrier density as compared with the AlGaInP layer formed on a flat face. Therefore, by appropriately controlling the amount of dopant to the AlGaInP current-confining cladding layer 25, a region of the AlGaInP current-confining cladding layer 25 formed on the flat portion is an n-AlGaInP layer, and the region of the AlGaInP current-confining cladding layer 25 formed on the stripe groove is a p-AlGaInP region 26. As a result, the current can efficiently be confined in the V-shaped portion by the use of the AlGaInP layer without the SiO₂ current-confining layer, so that operations at a low current can be performed.

According to the semiconductor laser of this example, the stable fundamental lateral mode oscillation can be attained in the V-shaped groove bottom portion. The oscillating wavelength of the fabricated semiconductor laser is 630 nm, and the threshold current is as low as 18 mA. These values show that the current is efficiently injected in the stripe groove. The current is continuously passed under the conditions of 50° C. and 10 mW. Moreover, even after 1000 hours, no deterioration can be observed. This means that the crystal of good crystallinity is formed.

EXAMPLE 3

Referring to FIGS. 4 and 5A to 5C, a semiconductor laser in a third example according to the invention will be described. The semiconductor laser of this example is a ZnSe-type semiconductor laser of a lateral mode control type.

Figure 4:
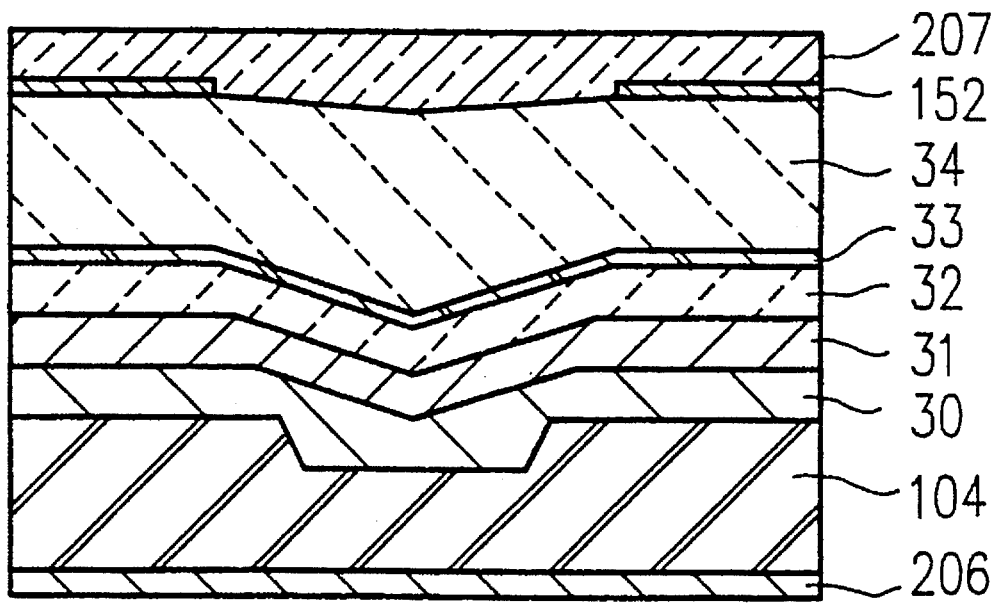
FIG. 4 is a cross-sectional view showing the structure of a semiconductor laser in a third example according to the invention.

As shown in FIG. 4, the semiconductor laser in this example includes a p-GaAs substrate 104 having a stripe groove formed in the upper face thereof, and a semiconductor multilayer structure formed on the substrate. The p-GaAs substrate 104 is a (100) GaAs substrate. The stripe groove extends along a <1–10> direction.

The semiconductor multilayer structure includes a p-GaAs layer 30 having a portion which has a surface of an (a11) crystal plane (a>1) and is positioned above the stripe groove, a p-AlGaInP layer 31, a p-ZnSSe cladding layer 32, a CdZnSe strained quantum well active layer 33, and an n-ZnSSe cladding layer 34, in this order. Alternatively, instead of the p-GaAs layer 30, another semiconductor which is expressed as $Al_xGa_{1-x}As$ layer ($0 \leq x \leq 1$) may be used.

On the n-ZnSSe cladding layer 34, an SiO₂ film 152 (an insulating film) having a stripe opening is provided. An n-side electrode 207 is deposited on the SiO₂ film 152 so as to be in contact with a part of the ZnSSe cladding layer 34 through the opening. A p-side electrode 206 is deposited on a bottom face of the p-GaAs substrate 104.

In the p-GaAs layer 30 formed on the stripe groove, the surface of the portion positioned above the stripe groove includes two slopes, so that the cross section of the surface is V-shaped. In this example, the slope is a (311) crystal plane. On the portion having the V-shaped surface of the p-GaAs layer 30, the cross section of a double-heterostructure including the p-ZnSSe cladding layer 32, the CdZnSe strained quantum well active layer 33, and the n-ZnSSe cladding layer 34 is also V-shaped. This is because these semiconductor layers are grown so as to maintain the V-shape of the underlying layers.

A current flowing between the p-side electrode 206 and the n-side electrode 207 is confined by the SiO₂ film 152. As a result, the current vertically flows through the V-shaped portions of the respective semiconductor layers. According to the structure of this example, laser light which stably oscillates in a single fundamental lateral mode can be obtained from the V-shaped portion of the active layer 33. The difference in the bandgap energy between ZnSSe and GaAs is very large. In general, at an interface between two semiconductor layers having the same conductivity type and different bandgaps, a potential barrier caused by the discontinuity of the band is formed. The height of such a barrier is larger for a higher degree of discontinuity of the band. Therefore, at the interface between GaAs and ZnSSe which have a large bandgap difference, a large potential barrier is formed. Thus, there conventionally exists a problem in that a very high operating voltage is required. However, according to this example, the AlGaInP layer 31 having an intermediate bandgap is inserted between the p-GaAs layer 30 and the p-ZnSSe cladding layer 32, so that the increase of series resistance due to the potential barrier can be suppressed. Accordingly, it is possible to perform at a low voltage.

Next, a method for fabricating the semiconductor laser shown in FIG. 4 will be described with reference to FIGS. 5A to 5C.

Figure 5A:
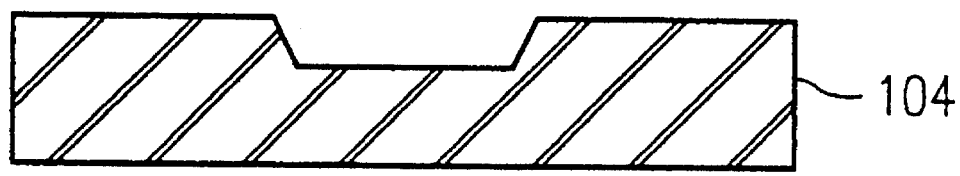
FIGS. 5A to 5C are cross-sectional views illustrating steps of a method for fabricating the semiconductor laser in the third example according to the invention.

First, as shown in FIG. 5A, a stripe groove is formed in an upper face of a p-GaAs substrate 104. The groove is formed in the following manner. After a photoresist having a stripe opening is formed on the upper face of the p-GaAs substrate 104, the exposed region of the p-GaAs substrate 104 is etched so as to reach an appropriate depth using the photoresist as an etching mask. For the etching, a sulfuric-acid type etchant can be used. The etching mask is not limited to the photoresist. The etching mask is only required to be formed of a material of which the etching rate is sufficiently lower than the etching rate of GaAs. The patterning of the etching mask is implemented so that the stripe opening extends along the <1–10> direction.

Figure 5B:
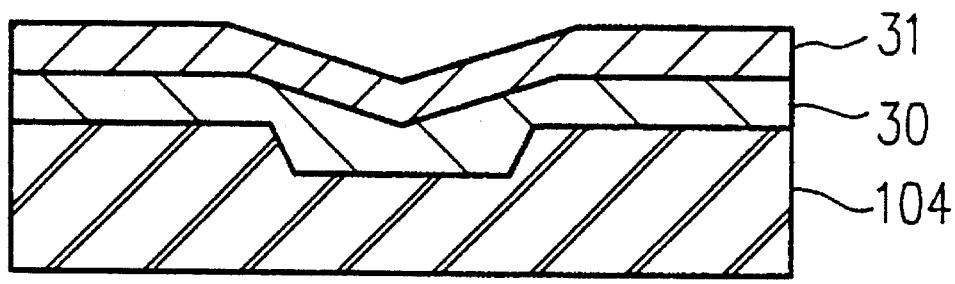

Next, using MOVPE, a p-GaAs layer 30 and a p-AlGaInP layer 31 are successively epitaxially grown on the stripe groove as shown in FIG. 5B. The growth process is described in detail below.

The substrate shown in FIG. 5A is degreased and cleaned. Then, immediately after an oxide layer formed on the surface of the substrate is removed by HCl, the substrate is located in an MOVPE growth furnace. Using trimethyl gallium (TMGa) and arsine (ASH$_3$), the p-GaAs layer 30 is formed under the conditions of the V/III ratio of 50 and the growth temperature of 600° C. As the p-type dopant, dimethyl zinc (DMZn) is used. Thereafter, the growth temperature is raised to 750° C., and trimethyl gallium (TMGa), trimethyl aluminum (TMA1), trimethyl indium (TMIn), and phosphine (PH$_3$) are used, so that the p-AlGaInP cladding layer 31 is grown.

Next, the substrate is transported into an MBE device under vacuum. As shown in FIG. 5C, a p-ZnSSe cladding layer 32, a ZnCdSe strained quantum well active layer 33, and an n-ZnSSe cladding layer 34 are successively formed.

Figure 5C:
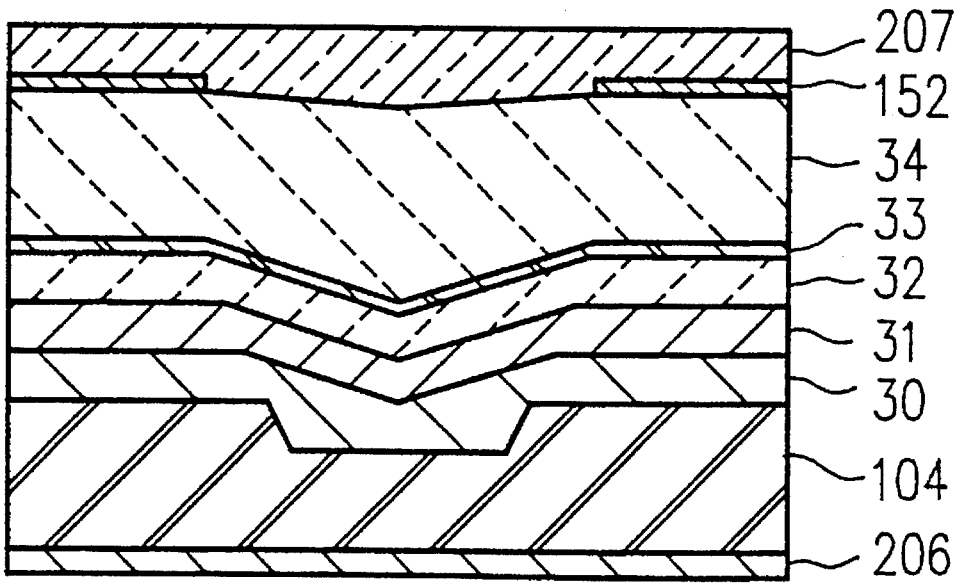

Next, an SiO$_2$ film (an insulating film) 152 for confining a current and electrodes 206 and 207 are formed by known methods, so as to obtain a semiconductor laser shown in FIG. 5C.

When the MOVPE growth is performed under the above-mentioned conditions, a (311) crystal plane appears at the surface of the portion of the p-GaAs layer 30 above the stripe groove, so as to obtain a V-shaped groove of the (311) face. In the p-AlGaInP layer 31 formed thereon, crystal having good crystallinity is grown while substantially maintaining the surface structure of the p-GaAs layer 30.

If an AlGaInP layer or a ZnSSe layer is formed on a ridge stripe having a side face of a (111) crystal plane by the conventional method, the AlGaInP layer or the ZnSSe layer formed on the side face includes many defects, and the surface thereof is rough. However, according to the study of the inventors of this invention, it is confirmed that an (a11) GaAs face (a>1) can appear under the limited condition of 400° C.<Tg<700° C., where Tg is the growth temperature, an AlGaInP layer can be grown on the (a11) face so as to have a good mirror surface under the limited condition of Tg>600° C., and the crystal growth of ZnSSe layer can be performed.

According to the semiconductor laser of this example, the stable fundamental lateral mode oscillation can be attained in the V-shaped groove bottom portion. The oscillating wavelength is 520 nm, and the threshold current is as low as 40 mA. In addition, the operating voltage is 6 V which is low for this material type.

EXAMPLE 4

Figure 6:
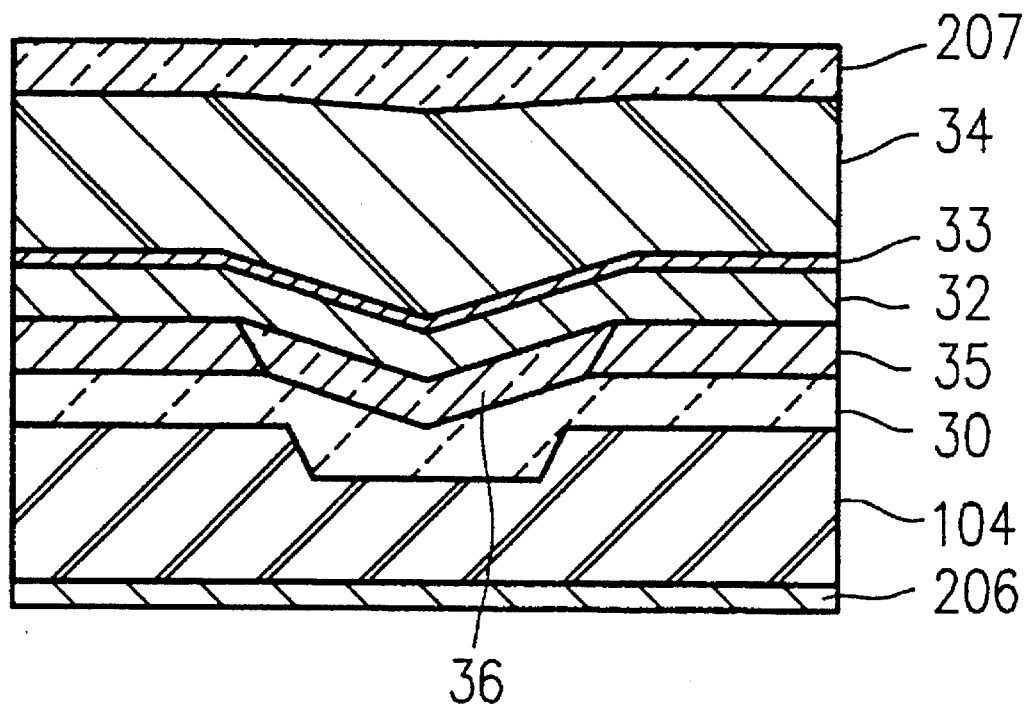
FIG. 6 is a cross-sectional view showing the structure of a semiconductor laser in a fourth example according to the invention.

Referring to FIG. 6, a semiconductor laser in a fourth example according to the invention will be described. In FIG. 6, like components are indicated by like reference numerals used in Example 3 shown in FIG. 4.

As shown in FIG. 6, the semiconductor laser in this example includes a p-GaAs substrate 104 having a stripe groove formed in the upper face thereof, and a semiconductor multilayer structure formed on the substrate. The p-GaAs substrate 104 is a (100) GaAs substrate. The stripe groove extends along a <1–10> direction.

The semiconductor multilayer structure includes a p-GaAs layer 30 having a portion which has a surface of an (a11) crystal plane (a>1) and is positioned above the stripe groove, an AlGaInP current-confining cladding layer 35, a p-ZnSSe cladding layer 32, a CdZnSe strained quantum well active layer 33, and an n-ZnSSe cladding layer 34, in this order. Alternatively, instead of the p-GaAs layer 30, another semiconductor which is expressed as Al$_x$Ga$_{1-x}$As layer (0≦x≦1) may be used.

On the n-ZnSSe cladding layer 34, an n-side electrode 207 is deposited. A p-side electrode 206 is deposited on a bottom face of the p-GaAs substrate 104.

Next, a method for fabricating the semiconductor laser shown in FIG. 6 will be described.

First, a stripe groove is formed in an upper face of a p-GaAs substrate 104. The groove is formed in the following manner. After a photoresist having a stripe opening is formed on the upper face of the p-GaAs substrate 104, the exposed region of the p-GaAs substrate 104 is etched so as to reach an appropriate depth using the photoresist as an etching mask. For the etching, a sulfuric-acid type etchant can be used. The etching mask is not limited to the photoresist. The etching mask is only required to be formed of a material of which the etching rate is sufficiently lower than the etching rate of GaAs. The patterning of the etching mask is implemented so that the stripe opening extends along the <1–10> direction.

Next, using MOVPE, a p-GaAs layer 30, an AlGaInP current-confining cladding layer 35, a p-ZnSSe cladding layer 32, a CdZnSe strained quantum well active layer 33, and an n-ZnSSe cladding layer 34 are successively epitaxially grown on the stripe groove. The growth process is described in detail below.

The substrate on which the stripe groove is formed is degreased and cleaned. Then, immediately after an oxide layer formed on the surface of the substrate is removed by HCl, the substrate is located in an MOVPE growth furnace. Using trimethyl gallium (TMGa) and arsine (AsH$_3$), the p-GaAs layer 30 is formed under the conditions of the V/III ratio of 50 and the growth temperature of 600° C. As the p-type dopant, dimethyl zinc (DMZn) is used. Thereafter, the growth temperature is raised to 750° C., and trimethyl gallium (TMGa), trimethyl aluminum (TMA1), trimethyl indium (TMIn), and phosphine (PH$_3$) are used, so that the AlGaInP current-confining cladding layer 35 is grown. As the p-type dopant, dimethyl zinc (DMZn) is used, and as the n-type dopant, monosilane (SiH$_4$) is used. When the AlGaInP current-confining cladding layer 35 is to be formed, doping of DMZn and doping of SiH$_4$ are simultaneously performed. Next, the substrate is transported into an MBE device under a vacuum. Under the condition of the growth temperature of 200° C., a p-ZnSSe cladding layer 32, a ZnCdSe strained quantum well active layer 33, and an n-ZnSSe cladding layer 34 are successively formed. Finally, electrodes 206 and 207 are formed, so as to obtain the semiconductor laser shown in FIG. 6.

The difference between Example 3 and Example 4 is that the AlGaInP current-confining cladding layer 35 in Example 4 has a current confining structure. According to the study by the inventors of this invention, the AlGaInP layer grown on the (a11) has a relatively higher p-type carrier density or a relatively lower n-type carrier density as compared with the AlGaInP layer formed on a flat face. Therefore, by appropriately controlling the amount of dopant to the AlGaInP current-confining cladding layer 35, a region of the AlGaInP current-confining cladding layer 35 formed on the flat portion is an n-AlGaInP layer, and the region of the AlGaInP current-confining cladding layer 35 formed on the stripe groove is a p-AlGaInP region 36. As a result, the current can efficiently be confined in the V-shaped portion by the use of the AlGaInP layer without the SiO$_2$ current-confining layer, so that an operation at a low current can be performed. The thus fabricated semiconductor laser can attain the stable fundamental lateral mode oscillation in the V-shaped groove bottom portion. The oscillation wavelength is 520 nm, and the threshold current is as low as 30 mA. These values show that the current is efficiently injected in the stripe groove. The operating voltage is 6 V which is low for this material type.

It is appreciated that the invention is not limited to the above-described examples. For example, the current confining layer can be provided in another portion. In addition, the conditions of the conductivity types of the substrate and the grown crystal, the thicknesses of respective layers, and the impurity concentrations can be selected as appropriate.

As described above, according to the invention, it is possible to provide a semiconductor laser which can stably oscillate in a signal lateral mode in a visible light range, especially in the range of wavelengths shorter than 650 nm, and can operate at a high temperature with a low threshold current. In addition, in the case of II–VI group semiconductor laser, it is possible to provide a semiconductor laser with high reliability which stably oscillates in a single lateral mode in the blue and green regions without increasing the operating voltage.

EXAMPLE 5

In a semiconductor laser, any catastrophic damage which leads to an oscillation disablement occurs immediately when the light output limit (i.e., a catastrophic optical damage (COD) level) is exceeded. At the crystal facet of the cavity, the recombination rate is increased due to the surface states, so that the bandgap is substantially narrowed and the absorption of laser light is increased. Accordingly, if the power of laser light is increased, a larger amount of heat is generated in this portion. This eventually results in the catastrophe of crystal. In order to prevent such a catastrophe, there is proposed a method for reducing the light absorption at the end face of the cavity, for example, as described in IEEE JOURNAL OF QUANTUM ELECTRONICS VOL. 27, p. 1496. According to the proposed method, when a p-GaAs contact layer is to be grown, Zn in a p-AlGaInP cladding layer in the vicinity of the cavity end face is diffused into a GaInP active layer. Due to this diffusion, the natural superlattice is disordered in the GaInP active layer, and the bandgap is increased. According to the production method, the COD level can be increased to be about 5 times in the continuous-wave (CW) oscillation at room temperature. However, in this production method, in order to effectively attain the effect of the diffusion, it is necessary to excessively dope the p-AlGaInP cladding layer with Zn as the dopant. Inactive Zn promotes the nonradiative recombination of carriers. This may possibly result in an increase of the threshold current. In addition, since Zn is diffused into a region other than the region in the vicinity of the cavity end face of the GaInP active layer, the impurities other than those at the end face cause point defects, such as problems in reliability due to the promotion of nonradiative recombination, the reduction of the lifetime of laser, and the like.

Hereinafter, referring to FIGS. 7 to 13, another method for producing a semiconductor laser according to the invention will be described.

Figure 8:
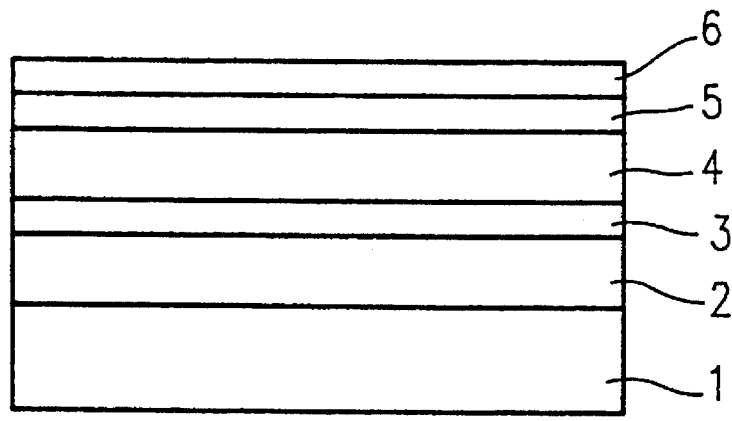
FIG. 8 is a cross-sectional view of a semiconductor laser at a stage in which a semiconductor multilayer structure is formed on a semiconductor substrate.

As shown in FIG. 8, using a low pressure MOVPE, an n-(Al$_{0.6}$Ga$_{0.4}$)$_{0.5}$In$_{0.5}$P cladding layer 2, an undoped Ga$_{0.5}$In$_{0.5}$P active layer 3, a p-(Al$_{0.6}$Ga$_{0.4}$)$_{0.5}$In$_{0.5}$P cladding layer 4, a p-Ga$_{0.5}$In$_{0.5}$P interlevel layer 5, and a p-GaAs cap layer 6 are successively grown on a (100) n-GaAs substrate 1, in a first crystal growth step. Thus, a wafer is obtained. A plurality of semiconductor lasers are fabricated from a single wafer.

The growth temperature for each of the semiconductors is 720° C., and the pressure is 76 Torr. Under the above-described growth conditions, a natural superlattice in which identical species atoms are arranged in order on a III group sub-lattice is formed in the undoped Ga$_{0.5}$In$_{0.5}$P active layer 3. Due to the existence of the natural superlattice, the bandgap of the undoped Ga$_{0.5}$In$_{0.5}$P active layer 3 is reduced. By disordering the natural superlattice, the bandgap can be increased depending on the degree of disorder, by about 50 meV at the best.

As the material gas used for the crystal growth, TMG (trimethyl gallium), TMA (trimethyl aluminum), TMI (trimethyl indium), AsH$_3$ (arsine), PH$_3$ (phosphine), Si$_2$H$_6$ (disilane), or DMZ (dimethyl zinc) can be used.

Figure 9:
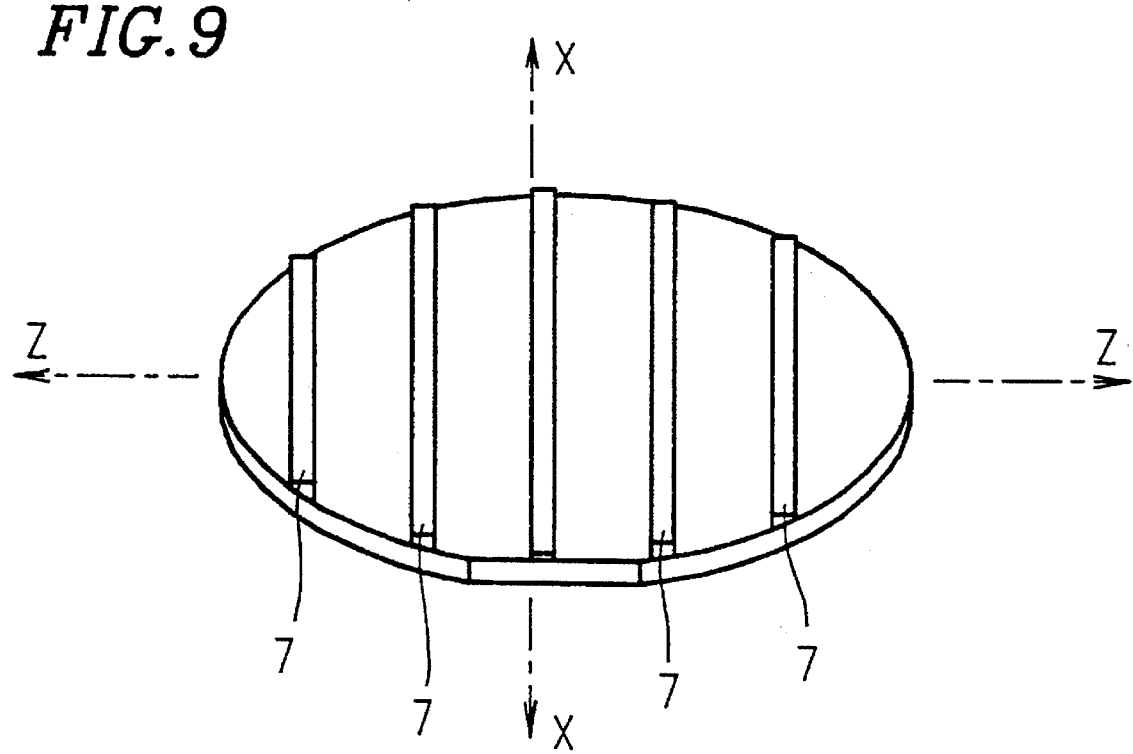
FIG. 9 is a perspective view showing a semiconductor laser in which a dielectric film is deposited.

Next, as shown in FIG. 9, on the wafer, an SiO$_2$ dielectric film (thickness: 0.6 μm) having a stripe pattern is formed. The SiO$_2$ dielectric film 7 is a mask layer against hydrogen atoms. The width of each stripe is typically 20 μm. The stripes of the SiO$_2$ dielectric film 7 are arranged in parallel to each other at an interval corresponding to a laser cavity length (350 μm). In other words, the stripes of the SiO$_2$ dielectric film 7 are located above portions of the semiconductor multilayer structure which are to be cavity edges. The pattern of the SiO$_2$ dielectric film 7 is not limited to the stripe pattern. It may be a lattice pattern. That is, it is sufficient that the pattern can cover the portions that are to be the cavity edges. A marking can be provided on a stripe of the SiO$_2$ dielectric film 7 which is positioned at the edge of the wafer, by point scribe or the like, as a mark used for cleaving the wafer.

Figure 7A:
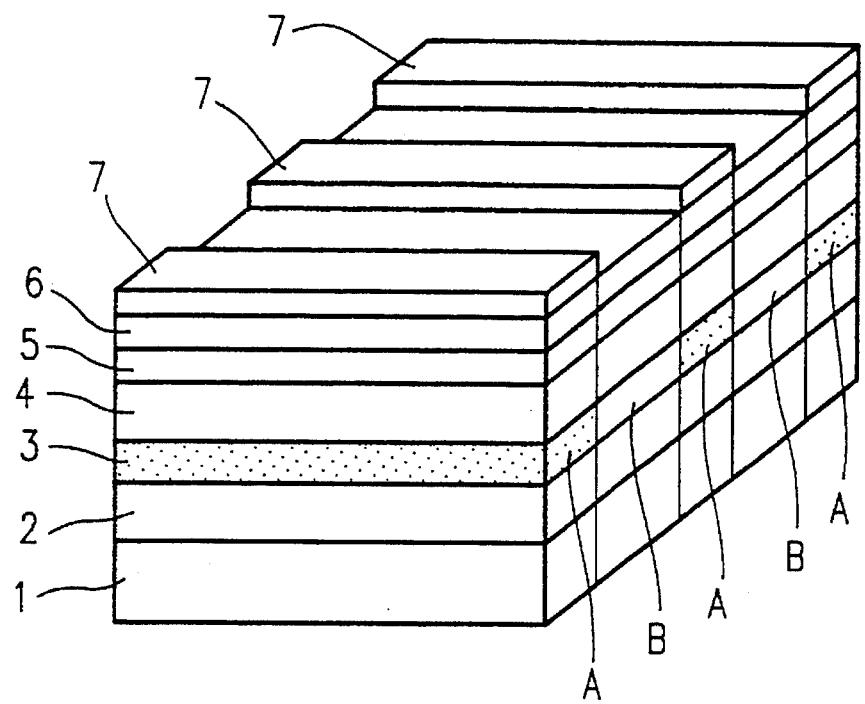
FIG. 7A is a perspective view showing the structure in the processing stage of a method for fabricating a semiconductor laser according to the invention.
Figure 7B:
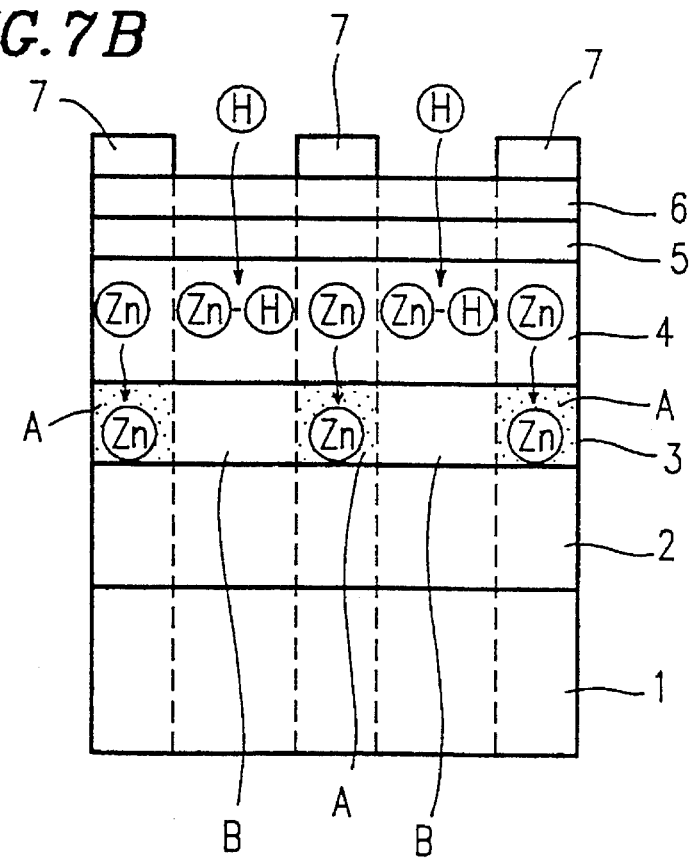
FIG. 7B is a cross-sectional view for illustrating the function at the process stage.

Next, the wafer on which the dielectric film 7 is deposited is treated in a mixed atmosphere of AsH$_3$ and H$_2$ at 750° C. and 76 Torr for 30 minutes. At this time, as shown in FIG. 7B (a cross-sectional view taken along Z—Z line of FIG. 9), hydrogen atoms H generated by the thermal decomposition of AsH$_3$ existing in the vapor phase are transmitted through portions of the p-GaAs cap layer 6 on which the stripes of the SiO$_2$ dielectric film 7 are not deposited. On the other hand, on the surface of the SiO$_2$ dielectric film 7, the thermal decomposition of AsH$_3$ does not occur.

The hydrogen atoms H transmitted into the crystal of the p-(Al$_{0.6}$Ga$_{0.4}$)$_{0.5}$In$_{0.5}$P cladding layer 4 function so as to terminate the defects and the dangling bonds around the impurities which lead to the impurity diffusion. As a result, in a region B of the undoped Ga$_{0.5}$In$_{0.5}$P active layer 3, Zn which is a dopant in the p-(Al$_{0.6}$Ga$_{0.4}$)$_{0.5}$In$_{0.5}$P cladding layer 4 is not diffused, so that the natural superlattice cannot be disordered.

On the other hand, through the portions on which the stripes of the SiO$_2$ dielectric film 7 are deposited, the hydrogen atoms H are not transmitted. Therefore, at an annealing temperature which is higher than the crystal growth temperature, active Zn paired with a vacancy or the like is also diffused in a region A of the undoped Ga$_{0.5}$In$_{0.5}$P active layer 3, which causes the natural superlattice to be disordered. That is, as shown in FIG. 7A, it is possible to realize a device structure in which only the laser cavity edge of the undoped Ga$_{0.5}$In$_{0.5}$P active layer 3 has a disordered region having a large bandgap.

Next, the hydrogen atoms and the Zn diffusion are described in more detail.

Figure 11A:
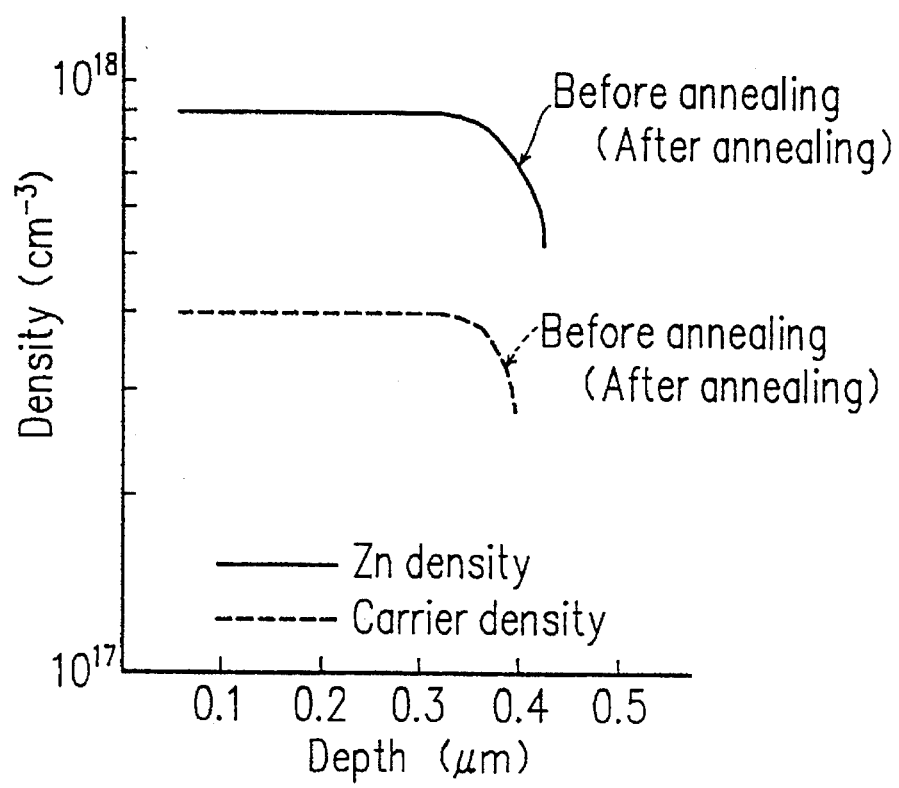
FIG. 11A is a graph showing a depth profile of a Zn density (solid line) and a carrier density (broken line) in a p-AlGaInP cladding layer without a dielectric film.
Figure 11B:
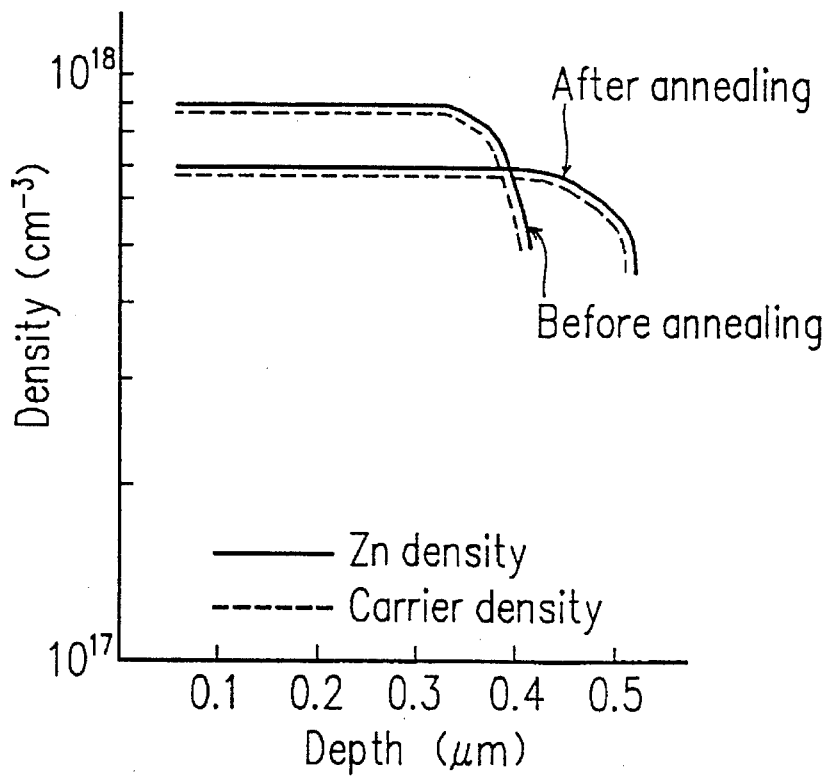
FIG. 11B is a graph showing a depth profile of a Zn density (solid line) and a carrier density (broken line) in a p-AlGaInP cladding layer with a dielectric film.

FIGS. 11A and 11B show the depth profiles of the Zn density (solid line) and the carrier density (broken line) of the p-$(Al_{0.6}Ga_{0.4})_{0.5}In_{0.5}P$ cladding layer 4. FIG. 11A shows the case where the $SiO_2$ dielectric film 7 is not provided, and FIG. 11B shows the case where the $SiO_2$ dielectric film 7 is provided. As is seen from FIG. 11A in the case without the $SiO_2$ dielectric film 7, the Zn density (solid line) and the carrier density (broken line) are not varied before and after the annealing. This means that the diffusion does not occur. The reason why the carrier density is about half of the Zn density is that the hydrogen atoms generated by the thermal decomposition of $AsH_3$ terminate the dangling bonds around Zn so as to inactivate them. On the other hand, as is seen from FIG. 11B in the case with the $SiO_2$ dielectric film 7, the Zn density is reduced after the annealing. This means that the diffusion occurs. The condition in which the Zn density is equal to the carrier density before and after the annealing indicates that about 100% of Zn is activated in each state. Since about 100% of Zn is activated, it is seen that the nonradiative recombination of carriers can be avoided, and the increase of oscillation threshold current can be avoided.

Figure 12:
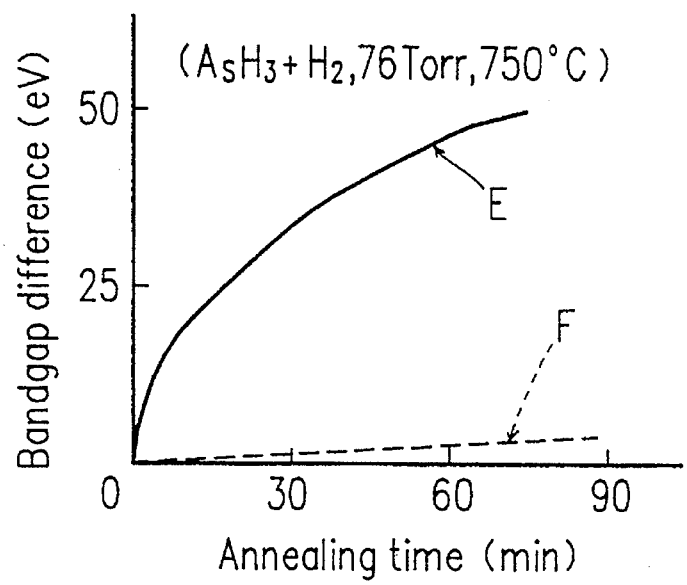
FIG. 12 is a graph showing the change of bandgap which depends on the annealing time by the annealing of an undoped GaInP active layer.

FIG. 12 is a graph showing the change of bandgap depending on the annealing time obtained from the photoluminescence of the undoped $Ga_{0.5}In_{0.5}P$ active layer 3. In a sample E which is provided with the $SiO_2$ dielectric film 7, a high energy shift is attained by the disordering of the natural superlattice. In a sample F which is not provided with the $SiO_2$ dielectric film 7, the bandgap is hardly changed. Accordingly, the region A corresponding to the cavity edge shown in FIG. 7 is a region with a large bandgap and without light absorption.

Figure 10:
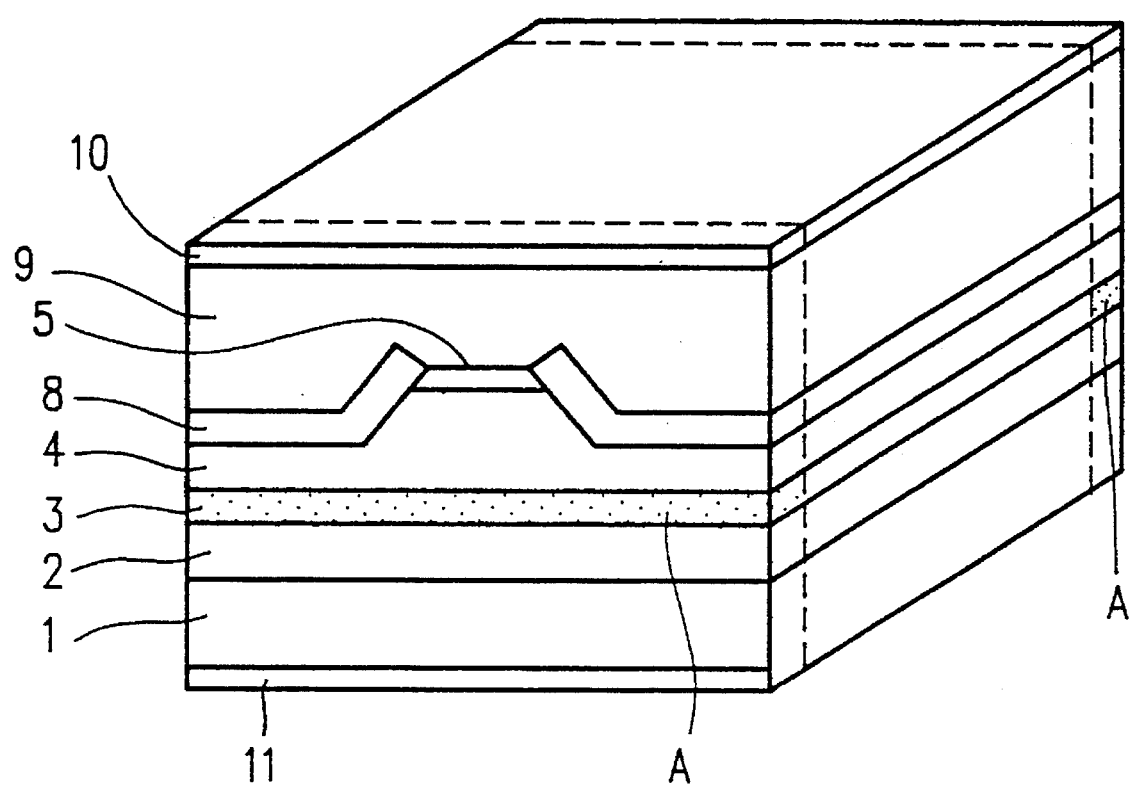
FIG. 10 is a view showing an exemplary semiconductor laser fabricated by the fabrication method according to the invention.

Next, the wafer is immersed in hydrofluoric acid, so that the $SiO_2$ dielectric film 7 is removed. Thereafter, using another $SiO_2$ mask, the $p(Al_{0.6}Ga_{0.4})_{0.5}In_{0.5}P$ cladding layer 4 is etched, so as to form a mesa stripe along a <1–10> direction. Next, after an n-GaAs current-confining layer 8 is selectively grown so as to bury both sides of the mesa stripe in a second crystal growth step, the $SiO_2$ mask is removed. Next, in a third crystal growth step, a p-GaAs contact layer 9 is deposited, and then an anode 10 and a cathode 11 are formed. Finally, the wafer fabricated through the above-described crystal growth steps is cleaved so as to obtain laser bars each having a cavity length of 350 μm. As a result, the semiconductor laser shown in FIG. 10 is obtained. Note that the semiconductor laser shown in FIG. 10 is merely an exemplary one to which the present invention is applied.

Figure 13:
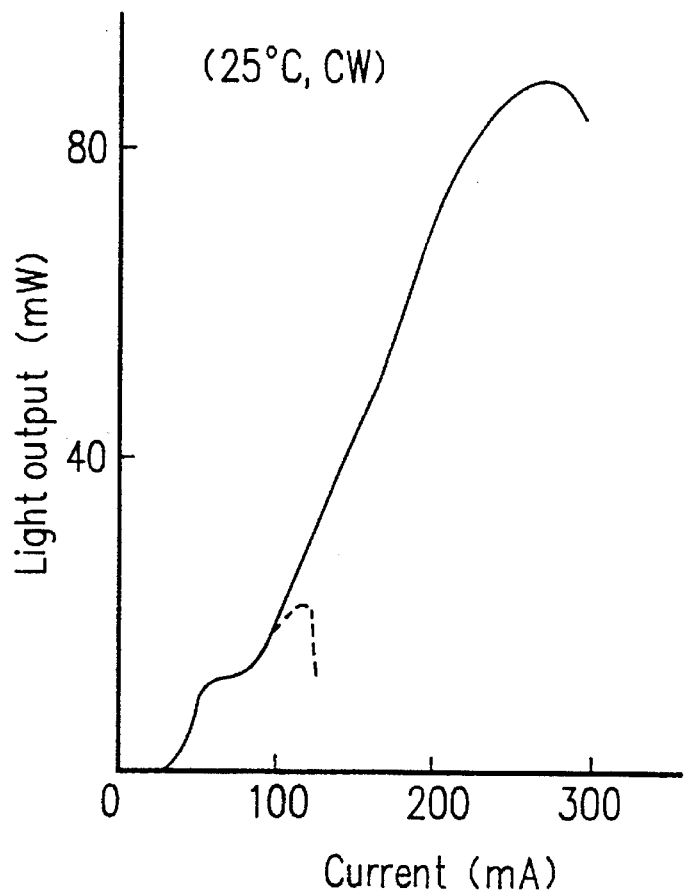
FIG. 13 is a graph showing an I–L characteristic of the semiconductor laser shown in FIG. 10.

When the I–L characteristic of the thus obtained semiconductor laser is examined, as shown in FIG. 13, it is seen that the semiconductor laser has a lower threshold current and a higher COD level as compared with conventional semiconductor lasers. In FIG. 13, a broken line indicates the case where there is no Zn diffusion.

According to this example, the Zn diffused region is positioned only in the vicinity of the cavity edge of the undoped $Ga_{0.5}In_{0.5}P$ active layer 3. Therefore, point defects such as interstitial atoms which cause waste nonradiative recombination cannot occur in the active layer. In addition, in this example, after the p-GaAs cap layer 6 is deposited on the wafer for lasers, the wafer is annealed in a mixed atmosphere of $AsH_3$ and $H_2$ containing As and hydrogen which constitute the cap layer 6. Accordingly, both the promotion of introduction of hydrogen atoms and the defect generation caused by As vacancy can be effectively suppressed.

In this example, the mixed atmosphere of $AsH_3$ and $H_2$ containing the constituent atoms of the cap layer is used as the annealing atmosphere. However, the annealing atmosphere is not limited thereto. It is apparent that so long as the atmosphere can utilize the effect that the dangling bond termination of hydrogen atom (hydrogen passivation) suppresses the impurity diffusion, the same effects can be attained. For example, an atmosphere of a hydrogen plasma, $PH_3$, $H_2$, or another hydride gas which contains atomic hydrogen can be used.

As a film for preventing the hydrogen atoms from being invaded into the wafer, the $SiO_2$ dielectric film 7 is used in this example. Another film through which the hydrogen atoms are difficult to transmit during the annealing, e.g., an undoped or N-type semiconductor film may also be used. Instead of a film through which the hydrogen atoms are difficult to transmit, a film by which the decomposition of hydride gas such as $AsH_3$ or $PH_3$ is suppressed at the surface thereof can also be used. The hydride gas such as $AsH_3$ or $PH_3$ is easily decomposed by the catalysis effect of the semiconductor surface, but it is difficult to be decomposed at the surface of the dielectric of $SiO_2$ or $Si_3N_4$. In the case where a film of a dielectric of $SiO_2$ or $Si_3N_4$ is used, even if the transmittance of hydrogen atoms through the film is high, the mask effect can be sufficiently achieved.

The stripe width of the dielectric film 7 is determined in view of the lateral diffusion of hydrogen, and the like. When the annealing is performed in the mixed atmosphere of $AsH_3$ and $H_2$ at 600° C. for 30 minutes, and the diffusion depth profile of hydrogen atoms is measured, it is found that the hydrogen atoms are distributed at a high density in a region within a depth of about 1 μm. From this fact, the effective diffusion length of hydrogen under the above-mentioned annealing conditions is estimated to be about 1 μm. Therefore, in this case, the hydrogen is diffused in the lateral direction by about 1 μm, so that the width of the dielectric film 7 is preferably set to be about 1 μm or more.

The material of the active layer for the semiconductor laser of this invention is not limited to the GaInP mixed crystal. If AlGaInP which forms the natural superlattice or II–VI compound semiconductor mixed crystal is used, the same effects as those in the above-described example can be attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a (100) GaAs substrate having at least one stripe groove formed on an upper face thereof, and a semiconductor multilayer structure formed on the substrate, wherein the stripe groove extends along a <1–10> direction and has a flat portion at a bottom thereof, and the semiconductor multilayer structure includes:

an $Al_xGa_{1-x}As$ layer ($0 \leq x \leq 1$) including a portion having a V-shaped top surface which is made of two adjoining (a11) crystal planes. (a>1), the portion being positioned on the stripe groove and having a flat bottom face on the flat portion of the stripe groove;

a pair of AlGaInP cladding layers provided on the $Al_xGa_{1-x}As$ layer ($0 \leq x \leq 1$); and an active layer sandwiched between the pair of AlGaInP cladding layers.

2. A semiconductor laser according to claim 1, wherein each of the pair of AlGaInP cladding layers includes a portion positioned above the stripe groove of the substrate, the portion including two slopes in a surface thereof.

3. A semiconductor laser according to claim 1, wherein at least one of the pair of AlGaInP cladding layers includes a first-type conductivity region and a second-type conductivity region, the second-type conductivity region being positioned above the stripe groove.

4. A semiconductor laser comprising:

a (100) GaAs substrate having at least one stripe groove formed on an upper face thereof; and a semiconductor multilayer structure formed on the substrate, wherein the stripe groove extends along a <1–10> direction and has a flat portion at a bottom thereof, and the semiconductor multilayer structure includes:

an $Al_xGa_{1-x}As$ layer ($0 \leq x \leq 1$) including a portion having a V-shaped top surface which is made of two adjoining (a11) crystal planes (a>1), the portion being positioned on the stripe groove and having a flat bottom face on the flat portion of the stripe groove;

an AlGaInP layer provided on the $Al_xGa_{1-x}As$ layer ($0 \leq x \leq 1$);

a pair of cladding layers of II–I group semiconductors, provided on the AlGaInP layer; and an active layer sandwiched between the pair of cladding layers.

5. A semiconductor laser according to claim 4, wherein each of the pair of cladding layers includes a portion positioned above the stripe groove of the substrate, the portion including two slopes in a surface thereof.

6. A semiconductor laser according to claim 4, wherein at least one of the pair of cladding layers includes a first-type conductivity region and a second-type conductivity region, the second-type conductivity region being positioned above the stripe groove.

* * * * *

UNITED STATES PATENT AND TRADE MARK OFFICE
CERTIFICATE OF CORRECTION

PATENT NO.   : 5,546,418
DATED        : August 13, 1996
INVENTOR(S)  : Ishibashi et al.

It is certified that error appears in the above-identified patent and that said Letters Patent is hereby corrected as shown below:

On the Cover Page, item:[75], Inventors, address for Masaya Mannou, delete "Hiragata" and insert --Hirakata--.

Column 14, claim 1, line 51, after "thereof" delete "," and insert --;--.

Column 14, claim 1, line 59, after "planes" delete --.--.

Column 14, line 62 delete "A1GalnP" and insert --A1GaInP--.

Column 16, line 5, delete "II-I" and insert --II-VI--.

Column 16, claim 4, line 6, before "layer" delete "AlGalnP" and insert --AlGaInP--.

Signed and Sealed this

Twenty-eighth Day of January, 1997

Attest:

BRUCE LEHMAN

*Attesting Officer*     *Commissioner of Patents and Trademarks*